(12) United States Patent
Takeda et al.

(10) Patent No.: US 6,912,685 B2
(45) Date of Patent: Jun. 28, 2005

(54) DECODING APPARATUS AND DECODING METHOD

(75) Inventors: Daisuke Takeda, Tokyo (JP); Manabu Mukai, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 595 days.

(21) Appl. No.: 09/816,165

(22) Filed: Mar. 26, 2001

(65) Prior Publication Data

US 2001/0034871 A1 Oct. 25, 2001

(30) Foreign Application Priority Data

Mar. 29, 2000 (JP) ......................................... 2000-092163
Mar. 14, 2001 (JP) ......................................... 2001-071358

(51) Int. Cl.[7] ............................................. H03M 13/00
(52) U.S. Cl. ....................... 714/781; 714/752; 714/746; 714/755; 714/786; 370/342; 375/147
(58) Field of Search ................................ 714/781, 752, 714/746, 792, 755, 756, 786; 370/342; 382/232; 375/261, 147

(56) References Cited

U.S. PATENT DOCUMENTS

| | | | |
|---|---|---|---|
| 3,402,393 A | | 9/1968 | Massey |
| 5,638,362 A | * | 6/1997 | Dohi et al. ................. 370/342 |
| 5,870,414 A | * | 2/1999 | Chaib et al. ................ 714/792 |
| 6,065,147 A | * | 5/2000 | Pyndiah et al. ............. 714/755 |
| 6,282,683 B1 | * | 8/2001 | Dapper et al. .............. 714/746 |
| 6,658,045 B1 | * | 12/2003 | Jin ............................. 375/147 |
| 6,662,336 B1 | * | 12/2003 | Zook ......................... 714/786 |

FOREIGN PATENT DOCUMENTS

| | | |
|---|---|---|
| GB | 2 146 875 A | 4/1985 |
| JP | 9-74359 | 3/1997 |
| WO | WO 98/11698 | 3/1998 |

OTHER PUBLICATIONS

Tokiwa et al., New Decoding Algorithm for Reed–Muller Codes, Sep. 1982, IEEE Transactions on Information Theory, vol. IT–28, No. 5, PP 779–787.*

W. Wesley Peterson, Error–Correcting codes (Reed–Muller Codes), 1961, The M.I.T. Press and John Wiley & Sons, Inc., pp. 73–77.*

3G TS 25.212 v3.3.0 (2000–6), Technical Specif ication, "3$^{rd}$ Generation Partnership Project; Technical Specification Group Radio Access Network : Multiplexing and Channel Coding (F DD)", pp. 47–52 (Release 1999).

TSG–RAN Working Group 1 Meeting #6, Harm onization Impact on TFCI and New Optimal Coding for extended TFCI with almost no Complexity Increase (rev 1), pp. 1–12, Jul. 13, 1999.

(Continued)

Primary Examiner—Guy J. Lamarre
Assistant Examiner—Dipakkumar Gandhi
(74) Attorney, Agent, or Firm—Finnegan, Henderson, Farabow, Garrett & Dunner, L.L.P.

(57) ABSTRACT

Decoding apparatus comprises EX-OR circuit exclusive ORing the Reed-Muller code and exclusive Ored value of mask symbol candidate pattern and the information data corresponding to the pattern, first decoder calculating checksum of the EX-OR circuit output and majority-judging the checksum to decode a part of the second portion of the information data, second decoder exclusive ORing the EX-OR circuit output and a product of the part of the second portion and the orthogonal codes and majority-judging the exclusive OR result to decode a remaining part of the second portion, Reed-Muller encoder encoding the information data, and minimum detector detecting the minimum of Euclidean distance between an output from the Reed-Muller encoder and the Reed-Muller code supplied to the arithmetic operation unit while a plurality of candidate patterns of the mask symbols are supplied to the arithmetic operation unit.

18 Claims, 9 Drawing Sheets

OTHER PUBLICATIONS

J.P. Chaib et al., "Combined Trellis/Reed–Muller Coding for CDMA," Indoor and Mobile Radio Communications, 1995. PIMRC '95. Wireless: Merging onto the Information Superhighway, Sixth IEEE International Symposium on Toronto, Ont., Canada, Sep. 27–29, 1995, New York, NY, USA, IEEE, US, Sep. 27, 1995, pp. 243–247.

Chun Wang et al., "Generalized Minimum Distance Decoding of Reed–Muller Codes and Barnes–Wall Lattices," Information Theory, 1995. Proceedings., 1995 IEEE International Symposium on Whistler, BC, Canada, Sep. 17–22, 1995, New York, NY, USA, IEEE, US, Sep. 17, 1995, p. 186.

* cited by examiner

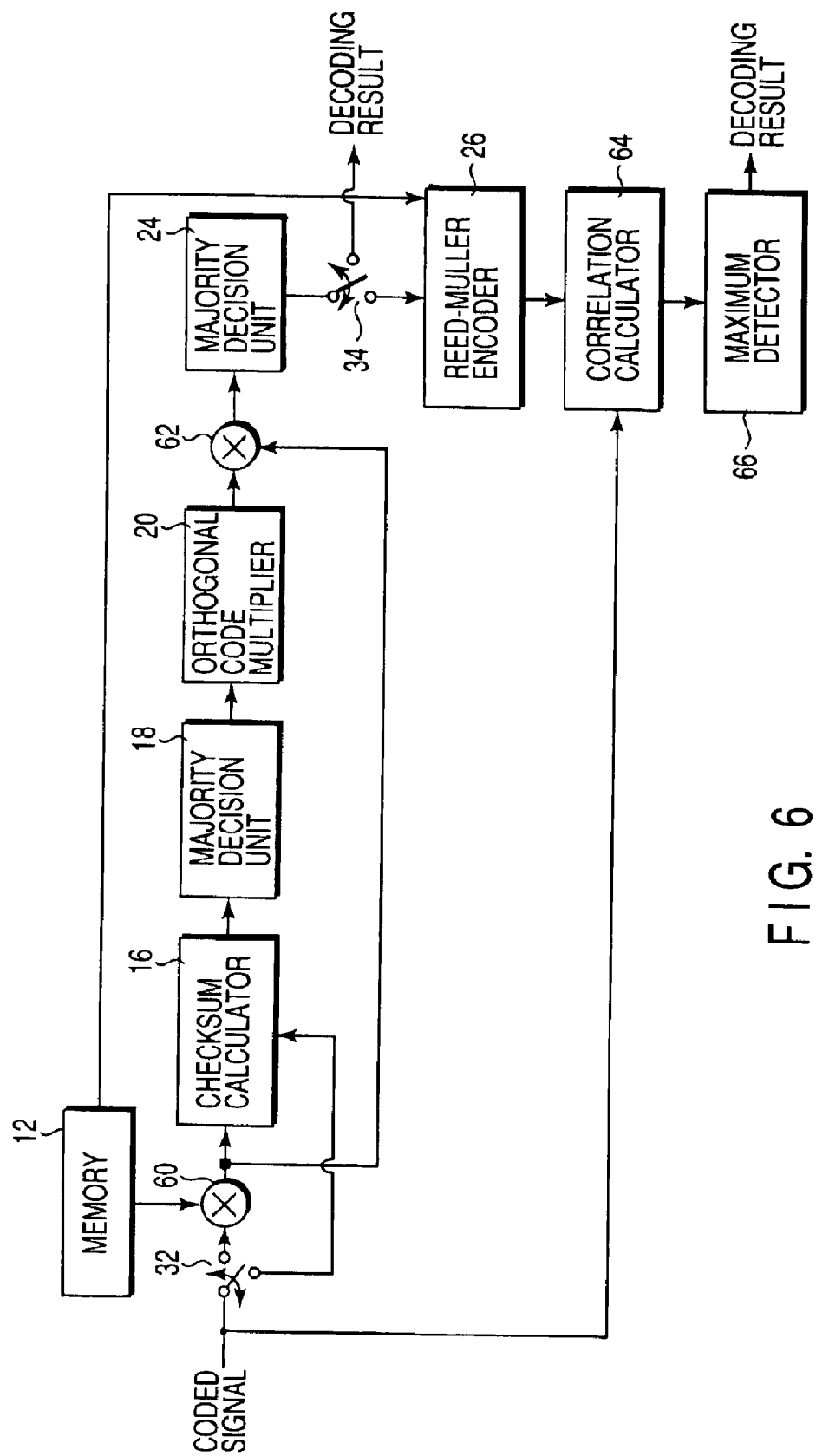
F I G. 6

DECODING APPARATUS AND DECODING METHOD

CROSS-REFERENCE TO RELATED APPLICATIONS

This application is based upon and claims the benefit of priority from the prior Japanese Patent Applications No. 2000-092163, filed Mar. 29, 2000; and No. 2001-071358, filed Mar. 14, 2001, the entire contents of both of which are incorporated herein by reference.

BACKGROUND OF THE INVENTION

The present invention relates to Reed-Muller decoding apparatus and decoding method.

Reed-Muller code is known as a kind of error correction code. An ordinary Reed-Muller code is (32, 6) Reed-Muller code for converting 6-bit information data into a 32-bit code word. For the Reed-Muller code, it is known that, suppose $n=2^m$ (n is a code length, m is a natural number (if n=32, m=5)), the minimum Euclidean distance between code words is $2^{m-r}$ (r is an order of code). In general, if the minimum Euclidean distance between code words is longer, the error correction code has better performance (resistant to errors). However, the longer the minimum Euclidean distance, the lower the transmission rate or coding efficiency. Therefore, in order to improve the performance of the Reed-Muller code without greatly lowering the transmission rate, a method is proposed to increase the minimum Euclidean distance by adding mask symbols to the conventional Reed-Muller code (3rd Generation Partnership Project; Technical Specification Group Radio Access Network; Multiplexing and channel coding (FDD) (Release 1999) 3G TS 25.212 V3.3.0 (2000–06). This code is called "(32, 10) Reed-Muller code" for converting a total 10-bit information data where 4-bit mask symbols are added to a 6-bit information data into a 32-bit code word.

It is known that the Reed-Muller code decoding apparatus can be realized by a simple majority decision circuit (Jpn. Pat. Appln. KOKAI Publication No. 9-74359). The majority decision circuit for (32, 6) Reed-Muller code can be realized relatively easily. However, for (32, 10) Reed-Muller code, it is difficult to calculate the checksum to be determined for the majority decision.

As an example of decoding without using a majority decision circuit, a maximum likelihood decoding by calculating a correlation value is known (Harmonization impact of TFCI and New Optimal Coding for extended TFCI with almost no complexity increase (rev 1) TSGR #6 (99) 970). However, calculating the correlation of all code words for a received coded signal, essentially, operation load is high in this method, increasing the hardware scale; therefore, this method is difficult to realize for (32, 10) Reed-Muller code.

As mentioned above, it has been difficult to realize the decoding apparatus for recently proposed Reed-Muller code containing mask symbols which is resistant to the error.

BRIEF SUMMARY OF THE INVENTION

Accordingly, the present invention is directed to method and apparatus that substantially obviates one or more of the problems due to limitations and disadvantages of the related art.

In accordance with the purpose of the invention, as embodied and broadly described, the invention is directed to reduce the operation load and hardware scale of the decoding apparatus using mask symbols.

According to the present invention, there is provided an apparatus for decoding Reed-Muller code in which information data is encoded by using mask symbols and orthogonal codes, the information data including a first portion and a second portion, the apparatus comprising:

an arithmetic operation unit configured to calculate a first exclusive OR of the Reed-Muller code and an exclusive ORed value of a candidate pattern of the mask symbols and the information data corresponding to the candidate pattern;

a first decoder configured to calculate a checksum of the first exclusive OR and majority-decide the checksum to decode a part of the second portion of the information data corresponding to the orthogonal codes;

a second decoder configured to calculate a second exclusive OR of the first exclusive OR and a product of the part of the second portion of the information data and the orthogonal codes and majority-decide the second exclusive OR to decode a remaining part of the second portion of the information data corresponding to the orthogonal codes;

a Reed-Muller encoder configured to Reed-Muller encode the second portion of the information data output from the first decoder and the second decoder and the first portion of the information data;

a minimum distance detector configured to detect the minimum of a Euclidean distance between an output from the Reed-Muller encoder and the Reed-Muller code supplied to the arithmetic operation unit while a plurality of candidate patterns of the mask symbols are supplied to the arithmetic operation unit, whereby the first portion of the information data is decoded based on the mask symbols corresponding to the minimum of the Euclidean distance.

According to the present invention, there is provided a method of decoding Reed-Muller code in which information data is encoded by using mask symbols and orthogonal codes, the information data including a first portion and a second portion, the method comprising:

calculating a first exclusive OR of the Reed-Muller code and an exclusive ORed value of a candidate pattern of the mask symbols and the information data corresponding to the candidate pattern;

calculating a checksum of the first exclusive OR and majority-judging the checksum to decode a part of the second portion of the information data corresponding to the orthogonal codes;

calculating a second exclusive OR of the first exclusive OR and a product of the part of the second portion of the information data and the orthogonal codes and majority-judging the second exclusive OR to decode a remaining part of the second portion of the information data corresponding to the orthogonal codes;

Reed-Muller encoding the decoded second portion of the information data and the first portion of the information data; and detecting the minimum of a Euclidean distance between the Reed-Muller encoded data and an input Reed-Muller code while a plurality of first exclusive ORs are calculated, whereby the first portion of the information data is decoded based on the mask symbols corresponding to the minimum of the Euclidean distance.

According to the present invention, there is provided another apparatus for decoding Reed-Muller code in which information data is encoded by using mask symbols and orthogonal codes, the information data including a first portion and a second portion, the apparatus comprising:

an arithmetic operation unit configured to calculate a first product of the Reed-Muller code and an exclusive ORed value of a candidate pattern of the mask symbols and the information data corresponding to the candidate pattern;

a first decoder configured to calculate a checksum of the first product and majority-decide the checksum to decode a part of the second portion of the information data corresponding to the orthogonal codes;

a second decoder configured to calculate a second product of the first product and a product of the part of the second portion of the information data and the orthogonal codes and majority-decides the second product to decode a remaining part of the second portion of the information data corresponding to the orthogonal codes;

a Reed-Muller encoder configured to Reed-Muller encode the second portion of the information data output from the first decoder and the second decoder and the first portion of the information data;

a maximum correlation detector configured to detect the maximum of a correlation between an output from the Reed-Muller encoder and the Reed-Muller code supplied to the arithmetic operation unit while a plurality of candidate patterns of the mask symbols are supplied to the arithmetic operation unit, whereby the first portion of the information data is decoded based on the mask symbols corresponding to the maximum of the correlation.

According to the present invention, there is provided another method of decoding Reed-Muller code in which information data is encoded by using mask symbols and orthogonal codes, the information data including a first portion and a second portion, the method comprising:

calculating a first product of the Reed-Muller code and an exclusive ORed value of a candidate pattern of the mask symbols and the information data corresponding to the candidate pattern;

calculating a checksum of the first product and majority-decide the checksum to decode a part of the second portion of the information data corresponding to the orthogonal codes;

calculating a second product of the first product and a product of the part of the second portion of the information data and the orthogonal codes and majority-decides the second product to decode a remaining part of the second portion of the information data corresponding to the orthogonal codes;

Reed-Muller encoding the second portion of the information data and the first portion of the information data;

detecting the maximum of a correlation between the Reed-Muller encoded data and an input Reed-Muller code while a plurality of first products are calculated, whereby the first portion of the information data is decoded based on the mask symbols corresponding to the maximum of the correlation.

BRIEF DESCRIPTION OF THE SEVERAL VIEWS OF THE DRAWING

FIG. 6 shows the third embodiment of the decoding apparatus according to the present invention;

DETAILED DESCRIPTION OF THE INVENTION

An embodiment of a decoding apparatus according to the present invention will now be described with reference to the accompanying drawings.

First Embodiment

Figure 1:
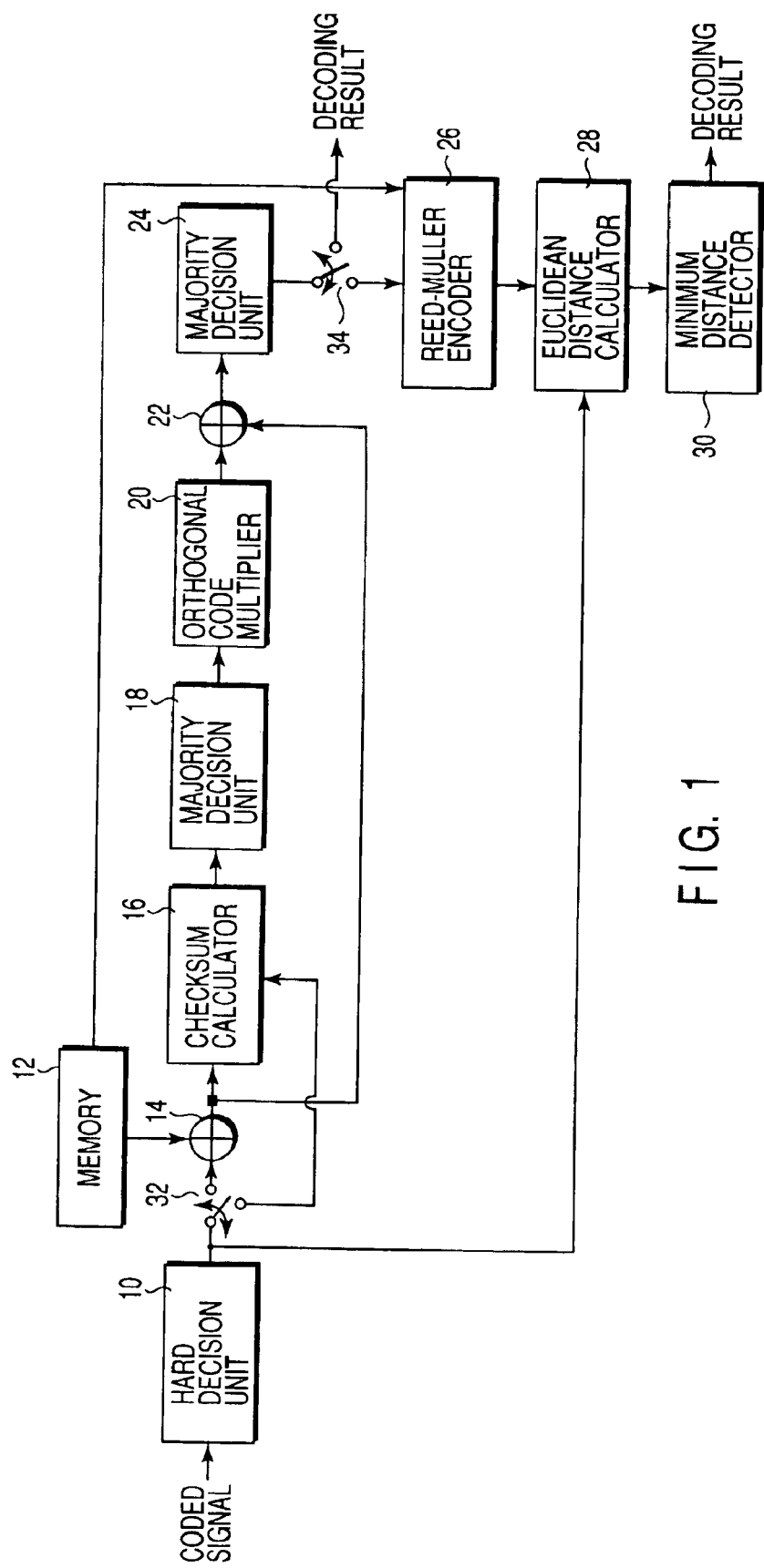
FIG. 1 shows the first embodiment of the decoding apparatus according to the present invention.

FIG. 1 shows a decoding apparatus of (32, 10) Reed-Muller code according to the first embodiment of the present invention. In (32, 10) Reed-Muller code, as the mask symbols are selected by 4-bit information data, patterns of the mask symbols (mask patterns) are $2^4=16$ patterns in total.

The following definition will be used for the description below.

"^" means an exclusive OR operation. For two vectors, A and B, "A^B" represents the exclusive OR of components of respective vectors A and B.

m(A) represents the vector A in which each of components 0 and 1 is changed to +1 and −1.

10-bit information data to be encoded are assumed to be $d_0, d_1, d_2, d_3, d_4, d_5, d_6, d_7, d_8$ and $d_9$. Each bit data $d_n$ is 0 or 1.

Orthogonal codes used for encoding are assumed to be $C_0, C_1, C_2, C_3, C_4$ and $C_5$. Each code $C_n$ is a 32-bit data, and 32 elements thereof are 0 or 1. Note that $C_0$ is a series of all 1.

Similarly, assuming mask symbols used for encoding be $M_1, M_2, M_3$ and $M_4$. Each mask symbol $M_n$ is a 32-bit data. The mask patterns $d_6M_1\char`\^ d_7M_2\char`\^ d_8M_3\char`\^ d_9M_4$, which are exclusive ORs of the mask symbols and the information data, have $2^4=16$ patterns.

Examples of the orthogonal codes $C_0$ to $C_5$ and the mask symbols $M_1$ to $M_4$ are shown in Table 1.

TABLE 1

| i | $C_{i,0}$ | $C_{i,1}$ | $C_{i,2}$ | $C_{i,3}$ | $C_{i,4}$ | $C_{i,5}$ | $M_{i,1}$ | $M_{i,2}$ | $M_{i,3}$ | $M_{i,4}$ |
|---|---|---|---|---|---|---|---|---|---|---|
| 0 | 1 | 0 | 0 | 0 | 0 | 1 | 0 | 0 | 0 | 0 |
| 1 | 1 | 0 | 0 | 0 | 1 | 0 | 1 | 0 | 0 | 0 |
| 2 | 1 | 0 | 0 | 0 | 1 | 1 | 0 | 0 | 0 | 1 |
| 3 | 1 | 0 | 0 | 1 | 0 | 0 | 1 | 0 | 1 | 1 |
| 4 | 1 | 0 | 0 | 1 | 0 | 1 | 0 | 0 | 0 | 1 |
| 5 | 1 | 0 | 0 | 1 | 1 | 0 | 0 | 0 | 1 | 0 |
| 6 | 1 | 0 | 1 | 1 | 1 | 1 | 0 | 1 | 0 | 0 |
| 7 | 1 | 0 | 1 | 0 | 0 | 0 | 0 | 1 | 1 | 0 |
| 8 | 1 | 0 | 1 | 0 | 0 | 1 | 1 | 1 | 1 | 0 |
| 9 | 1 | 0 | 1 | 0 | 1 | 0 | 1 | 0 | 1 | 1 |
| 10 | 1 | 0 | 1 | 0 | 1 | 1 | 0 | 0 | 1 | 1 |
| 11 | 1 | 0 | 1 | 1 | 0 | 0 | 0 | 1 | 1 | 0 |
| 12 | 1 | 0 | 1 | 1 | 0 | 1 | 0 | 1 | 0 | 1 |
| 13 | 1 | 0 | 1 | 1 | 1 | 0 | 1 | 0 | 0 | 1 |
| 14 | 1 | 0 | 1 | 1 | 1 | 1 | 1 | 1 | 1 | 1 |
| 15 | 1 | 1 | 0 | 0 | 0 | 1 | 1 | 1 | 0 | 0 |
| 16 | 1 | 1 | 0 | 0 | 1 | 0 | 1 | 1 | 0 | 1 |
| 17 | 1 | 1 | 0 | 0 | 1 | 1 | 1 | 0 | 1 | 0 |
| 18 | 1 | 1 | 0 | 1 | 0 | 0 | 0 | 1 | 1 | 1 |
| 19 | 1 | 1 | 0 | 1 | 0 | 1 | 0 | 1 | 0 | 1 |

TABLE 1-continued

| i | $C_{i,0}$ | $C_{i,1}$ | $C_{i,2}$ | $C_{i,3}$ | $C_{i,4}$ | $C_{i,5}$ | $M_{i,1}$ | $M_{i,2}$ | $M_{i,3}$ | $M_{i,4}$ |
|---|---|---|---|---|---|---|---|---|---|---|
| 20 | 1 | 1 | 0 | 1 | 1 | 0 | 0 | 0 | 1 | 1 |
| 21 | 1 | 1 | 0 | 1 | 1 | 1 | 0 | 1 | 1 | 1 |
| 22 | 1 | 1 | 1 | 0 | 0 | 0 | 0 | 1 | 0 | 0 |
| 23 | 1 | 1 | 1 | 0 | 0 | 1 | 1 | 1 | 0 | 1 |
| 24 | 1 | 1 | 1 | 0 | 1 | 0 | 1 | 0 | 1 | 0 |
| 25 | 1 | 1 | 1 | 0 | 1 | 1 | 1 | 0 | 0 | 1 |
| 26 | 1 | 1 | 1 | 1 | 0 | 0 | 0 | 0 | 1 | 0 |
| 27 | 1 | 1 | 1 | 1 | 0 | 1 | 1 | 1 | 0 | 0 |
| 28 | 1 | 1 | 1 | 1 | 1 | 0 | 1 | 1 | 1 | 0 |
| 29 | 1 | 1 | 1 | 1 | 1 | 1 | 1 | 1 | 1 | 1 |
| 30 | 1 | 0 | 0 | 0 | 0 | 0 | 0 | 0 | 0 | 0 |
| 31 | 1 | 1 | 0 | 0 | 0 | 0 | 1 | 0 | 0 | 0 |

An encoding apparatus encodes the aforementioned information data "d" based on the orthogonal codes $C_0$ to $C_5$ and the mask symbols $M_1$ to $M_4$, and outputs the following 32-bit coded signal "s." Here, the orthogonal codes and the mask symbols to be multiplied with each bit of the information data are predetermined.

$$s = d_0 C_0 \char`\^ d_1 C_1 \char`\^ d_2 C_2 \char`\^ d_3 C_3 \char`\^ d_4 C_4 \char`\^ d_5 C_5 \char`\^ d_6 M_1 \char`\^ d_7 M_2 \char`\^ d_8 M_3 \char`\^ d_9 M_4 \quad (1)$$

The 32-bit coded signal "s" is modulated and output as m(s). In this embodiment, the following signal in which an error due to transfer path or noise is added to the modulated signal m(s) is input to the decoding apparatus of FIG. 1, and hard-decided by a hard decision unit 10.

The hard decision unit 10 reproduces the original values 0 and 1, when the value +1 and −1 corresponding to the original values 0 and 1 becomes other values such as 0.2, 1.8, −1.2 or the like due to noise or the like. Thus, the hard decision unit 10 outputs a sum of the 32-bit coded signal "s" and an error signal "e."

A memory 12 stores the orthogonal codes $C_0$ to $C_5$, the mask symbols $M_1$ to $M_4$ of Table 1, and 16 mask patterns $d_6 M_1 \char`\^ d_7 M_2 \char`\^ d_8 M_3 \char`\^ d_9 M_4$ not shown in Table 1. Here, "i" represents a bit position.

An exclusive OR circuit 14 calculates an exclusive OR of one of the mask patterns stored in the memory 12 and the output from the hard decision circuit 10.

An output from the exclusive OR circuit 14 is supplied to a checksum calculator 16. The calculator 16 calculates 16 checksums for each of 5 bits of $d_1$ to $d_5$ (80 checksums in total), among 10-bit information data $d_0$ to $d_9$.

A majority decision unit 18 decides a majority of the 80 checksums output from the checksum calculator 16 to decode bits $d_1'$ to $d_5'$ corresponding to the orthogonal codes $C_1$ to $C_5$. To be more specific, concerning the checksum, it is decided to be 0 if 0 is majority, and 1 if 1 is majority.

An orthogonal code multiplier 20 multiplies 5-bit data $d_1'$ to $d_5'$ by the orthogonal codes.

An exclusive OR circuit 22 calculates an exclusive OR of the exclusive OR output from the exclusive OR circuit 14 and the output from the orthogonal code multiplier 20. A majority decision unit 24 decides a majority of the exclusive OR output from the exclusive OR circuit 22 to decode bit $d_0'$. To be more specific, concerning the exclusive OR, it is decided to be 0 if 0 is majority, and 1 if 1 is majority. When the bit $d_0'$ of the information data is determined by the majority decision unit 24, bits $d_6'$ to $d_9'$ of the information data can be determined based on the mask pattern used for determining the bit $d_0'$.

The operation mentioned above, i.e., exclusive ORing the Reed-Muller code input to the decoding apparatus and the exclusive OR of the mask pattern and the information data, allows to exclude the mask pattern from the Reed-Muller code. The Reed-Muller code excluding the mask pattern is easily majority-decided. The bit data $d_0'$ to $d_9'$ are determined by multiplying the result of the majority-decision by the orthogonal codes. The bit data $d_0'$ to $d_9'$ are Reed-Muller encoded by a Reed-Muller encoder 26. The output from the Reed-Muller encoder 26 is supplied to a Euclidean distance calculator 28. The Euclidean distance between the output from the Reed-Muller encoder 26 and the received coded signal output from the hard decision unit 10 is calculated.

The aforementioned processing is performed for all 16 kinds of mask patterns, and the minimum Euclidean distance is detected by a minimum distance detector 30. Bit data $d_0'$ to $d_9'$ at the time when the minimum distance is detected are considered to be correct, completing the decoding.

Figure 2:
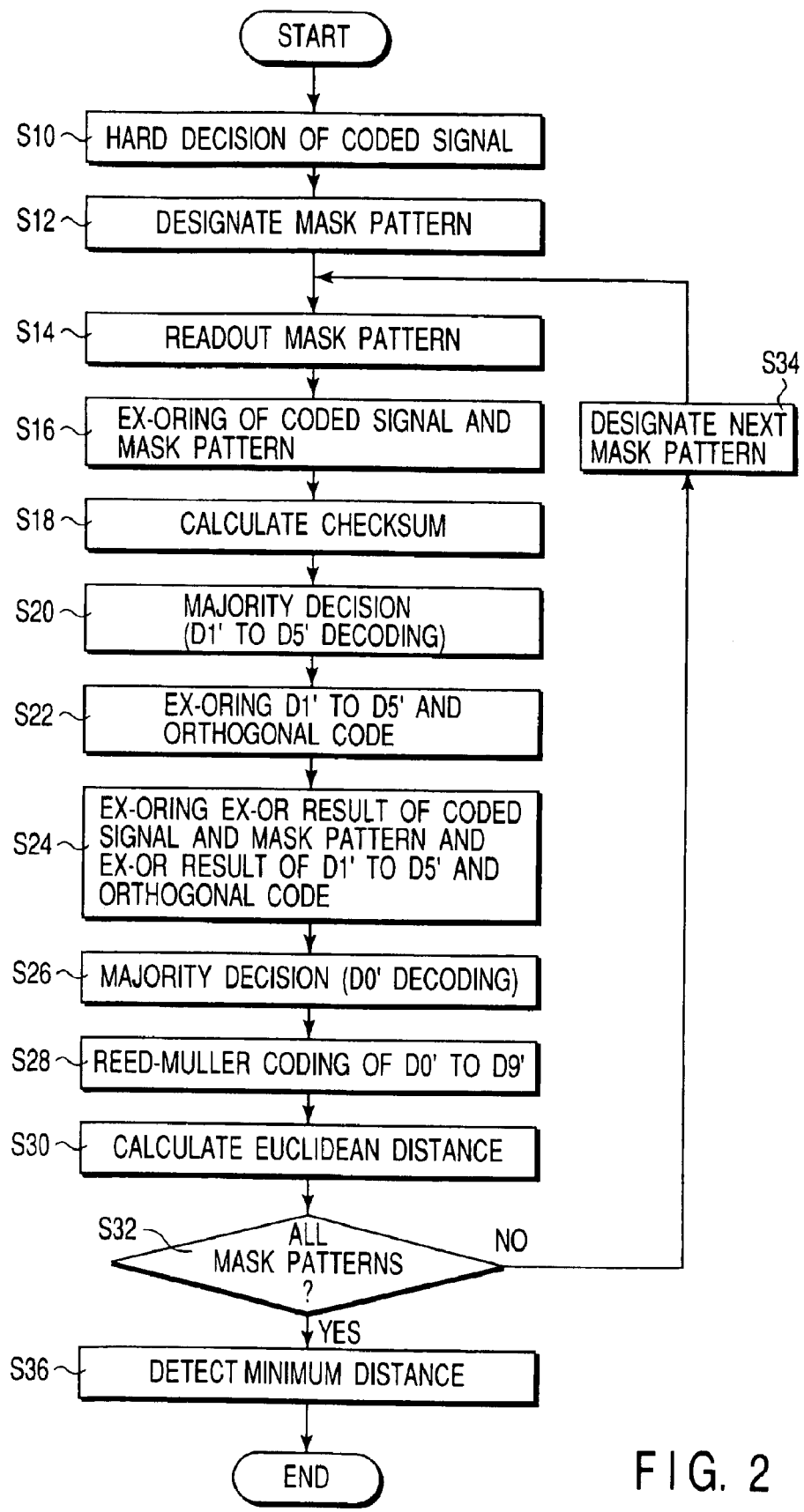
FIG. 2 is a flow chart showing an operation flow of the first embodiment.

FIG. 2 is a flow chart of the first embodiment.

In step S10, the hard decision unit 10 hard-decides the coded signal. The coded signal input in this decoding apparatus is not the modulated signal m(s) output from the encoding apparatus, but the following signal in which error "e" due to transfer path or noise is added to m(s).

$$d_0 C_0 \char`\^\char`\^ d_1 C_1 \char`\^\char`\^ d_2 C_2 \char`\^\char`\^ d_3 C_3 \char`\^\char`\^ d_4 C_4 \char`\^\char`\^ d_5 C5 \char`\^\char`\^ d_6 M_1 \char`\^\char`\^ d_7 M_2 \char`\^\char`\^ d_8 M_3 \char`\^\char`\^ d_9 M_4 \char`\^\char`\^ e \quad (2)$$

In the hard decision, the original values 0 and 1 are reproduced when the values +1 and −1 corresponding to the original values 0 and 1 become other values such as 0.2, 1.8, −1.2 or the like due to noise or the like.

One mask pattern is specified in step S12, this specified mask pattern is read out from the memory 12 in step S14, and the exclusive OR circuit 14 calculates in step S16 the exclusive OR of the coded signal output from the hard decision unit 10 and the mask pattern.

The memory 12 stores the orthogonal codes $C_0$ to $C_5$, mask symbols $M_1$ to $M_4$, and 16 mask patterns $d_6 M_1 \char`\^ d_7 M_2 \char`\^ d_8 M_3 \char`\^ d_9 M_4$ not shown in Table 1. "i" represents a bit position.

Supposing the mask pattern read out from the memory 12 be $M' = d_6' M_1 \char`\^ d_7' M_2 \char`\^ d_8' M_3 \char`\^ d_9' M_4$, the exclusive OR output from the exclusive OR circuit 14 will be as follows.

$$d_0 C_0 \char`\^ d_1 C_1 \char`\^ d_2 C_2 \char`\^ d_3 C_3 \char`\^ d_4$$

$$C_4 \char`\^ d_5 C_5 \char`\^ (d_6 \char`\^ d_6') M_1 \char`\^ (d_7$$

$$\char`\^ d_7') M_2 \char`\^ (d_8 \char`\^ d_8') M_3 \char`\^ (d_9 \char`\^$$

$$d_9') M_4 \char`\^ e \quad (3)$$

In step S18, the checksum calculator 16 calculates the checksum of the expression (3) output from the exclusive OR circuit 14. Respectively, 16 checksums are calculated for 5 bits of $d_1$ to $d_5$, in the 10-bit information data of $d_0$ to $d_9$.

Checksums for $d_1$ $$d_1' = r_0 \times r_{30}$$

$$d_1' = r_1 \times r_2$$

$$d_1' = r_3 \times r_4$$

$$d_1' = r_5 \times r_6$$

$$d_1' = r_7 \times r_8$$

$$d_1' = r_9 \times r_{10}$$

$$d_1' = r_{11} \times r_{12}$$

$$d_1' = r_{13} \times r_{14}$$

$$d_1' = r_{15} \times r_{31}$$

$d_1'=r_{16}\times r_{17}$ $d_1'=r_{18}\times r_{19}$ $d_1'=r_{20}\times r_{21}$ $d_1'=r_{22}\times r_{23}$ $d_1'=r_{24}\times r_{25}$ $d_1'=r_{26}\times r_{27}$ $d_1'=r_{28}\times r_{29}$ Checksums for $d_2$ $d_2'=r_0\times r_2$ $d_2'=r_1\times r_{30}$ $d_2'=r_3\times r_5$ $d_2'=r_4\times r_6$ $d_2'=r_7\times r_9$ $d_2'=r_8\times r_{10}$ $d_2'=r_{11}\times r_{13}$ $d_2'=r_{12}\times r_{14}$ $d_2'=r_{15}\times r_{17}$ $d_2'=r_{16}\times r_{31}$ $d_2'=r_{18}\times r_{20}$ $d_2'=r_{19}\times r_{21}$ $d_2'=r_{22}\times r_{24}$ $d_2'=r_{23}\times r_{25}$ $d_2'=r_{26}\times r_{28}$ $d_2'=r_{27}\times r_{29}$ Checksums for $d_3$ $d_3'=r_0\times r_4$ $d_3'=r_1\times r_5$ $d_3'=r_2\times r_6$ $d_3'=r_3\times r_{30}$ $d_3'=r_7\times r_{11}$ $d_3'=r_8\times r_{12}$ $d_3'=r_9\times r_{13}$ $d_3'=r_{10}\times r_{14}$ $d_3'=r_{15}\times r_{19}$ $d_3'=r_{16}\times r_{20}$ $d_3'=r_{17}\times r_{21}$ $d_3'=r_{18}\times r_{31}$ $d_3'=r_{22}\times r_{26}$ $d_3'=r_{23}\times r_{27}$ $d_3'=r_{24}\times r_{28}$ $d_3'=r_{25}\times r_{29}$ Checksums for $d_4$ $d_4'=r_0\times r_8$ $d_4'=r_1\times r_9$ $d_4'=r_2\times r_{10}$ $d_4'=r_3\times r_{11}$ $d_4'=r_4\times r_{12}$ $d_4'=r_5\times r_{13}$ $d_4'=r_6\times r_{14}$ $d_4'=r_7\times r_{30}$ $d_4'=r_{15}\times r_{23}$ $d_4'=r_{16}\times r_{24}$ $d_4'=r_{17}\times r_{25}$ $d_4'=r_{18}\times r_{26}$ $d_4'=r_{19}\times r_{27}$ $d_4'=r_{20}\times r_{28}$ $d_4'=r_{21}\times r_{29}$ $d_4'=r_{22}\times r_{31}$ Checksums for $d_5$ $d_5'=r_0\times r_{15}$ $d_5'=r_1\times r_{16}$ $d_5'=r_2\times r_{17}$ $d_5'=r_3\times r_{18}$ $d_5'=r_4\times r_{19}$ $d_5'=r_5\times r_{20}$ $d_5'=r_6\times r_{21}$ $d_5'=r_7\times r_{22}$ $d_5'=r_8\times r_{23}$ $d_5'=r_9\times r_{24}$ $d_5'=r_{10}\times r_{25}$ $d_5'=r_{11}\times r_{26}$ $d_5'=r_{12}\times r_{27}$ $d_5'=r_{13}\times r_{28}$ $d_5'=r_{14}\times r_{29}$ $d_5'=r_{30}\times r_{31}$ $r_n$ (n=0, 1, ... 31) represents the 31-level (31-bit in the case of hard decision) signal supplied to the checksum calculator 16 after being multiplied by the mask pattern.

In step S20, these 80 outputs in total are decided by majority by the majority decision unit 18, and $d_1'$ to $d_5'$ are decoded. To be more specific, concerning the checksum output, it is decided to be 0 if 0 is majority, and 1 if 1 is majority.

In step S22, the orthogonal code multiplier 20 multiplies 5-bit information data $d_1'$ to $d_5'$ by the orthogonal codes corresponding to the 5-bit information data $d_1'$ to $d_5'$. The output from the orthogonal code multiplier 20 is as follows.

$$d_1{'}\hat{}C_1\hat{}d_2{'}\hat{}C_2\hat{}d_3{'}C_3\hat{}d_4{'}\hat{}C_4\hat{}d_5{'}C_5 \quad (4)$$

In step S24, the exclusive OR circuit 22 calculates the exclusive OR of the output (expression (3)) from the exclusive OR circuit 14 and the output (expression (4)) from the orthogonal code multiplier 20. The exclusive OR, which is output from the exclusive OR circuit 22 is as follows.

$$d_0 C_0\hat{}(d_1\hat{}d_1{'})C_1\hat{}(d_2\hat{}d_2{'})$$

$$C_2\hat{}(d_3\hat{}d_3{'})C_3\hat{}(d_4\hat{}$$

$$d_4{'})C_4\hat{}(d_5\hat{}d_5{'})C_5\hat{}(d_6\hat{}d_6{'})$$

$$M_1\hat{}(d_7\hat{}d_7{'})M_2\hat{}(d_8\hat{}d_8{'})M_3$$

$$\hat{}(d_9\hat{}d_9{'})M_4\hat{}e \quad (5)$$

Here, if $d_1'$ to $d_9'$ are correctly decoded, the term of $(d_n\hat{}d_n')C_n$ (n=1, 2, ... 9) becomes a 0 vector. In this case, the output (expression (5)) from the exclusive OR circuit 22 is as follows.

$$d_0 C_0\hat{}e \quad (6)$$

Since $C_0$ is all 1, $d_0'$ can be obtained by judging the output (expression (6)) from the exclusive OR circuit 22 by the majority decision unit 24 (step S26). To be more specific, each bit of the information data is decided to be 0 if 0 is majority, and 1 if 1 is majority in the output (expression (6)) from the exclusive OR circuit 22. When bit $d_0'$ of the information data is determined by the majority decision unit 24, bits $d_6'$ to $d_9'$ of the information data can be determined from the mask pattern used for this determination. The operation mentioned above allows to determine respective bits $d_0'$ to $d_9'$ of the information data.

This information data $d_0'$ to $d_9'$ is Reed-Muller encoded by the Reed-Muller encoder 26 as follows, in step S28.

$$d_0{'}C_0\hat{}d_1{'}C_1\hat{}d_2{'}C_2\hat{}d_3{'}C_3\hat{}d_4{'}C_4\hat{}d_5{'}C_5\hat{}d_6{'}M_1\hat{}d_7{'}M_2\hat{}d_8{'}M_3\hat{}d_9{'}M_4 \quad (7)$$

In step S30, the Euclidean distance calculator 28 calculates the Euclidean distance between the output (expression (7)) from the Reed-Muller encoder 26 and the received coded signal (expression (2)) output from the hard decision unit 10. To be more specific, first, the exclusive OR of the output (expression (7)) from the Reed-Muller encoder 26 and the output (expression (2)) from the hard decision unit 10 is obtained as follows:

$$(d_0\hat{}d_0{'})C_0\hat{}(d_1\hat{}d_1{'})C_1\hat{}$$

$$(d_2\hat{}d_2{'})C_2\hat{}(d_3\hat{}d_3{'})C_3\hat{}$$

$$(d_4\hat{}d_4{'})C_4\hat{}(d_5\hat{}d_5{'})C_5\hat{}(d_6\hat{}$$

$$\hat{}d_6{'})M_1\hat{}(d_7\hat{}d_7{'})M_2\hat{}(d_8\hat{}$$

$$d_8{'})M_3\hat{}(d_9\hat{}d_9{'})M_4\hat{}e \quad (8)$$

Expression (8) represents a 32-bit signal, and the sum of these 32 bits represents the Euclidean distance between the output (expression (7)) from the Reed-Muller encoder 26 and the output (expression (2)) from the hard decision unit 10.

In step S32, it is determined whether the aforementioned processing is performed for all 16 kinds of mask patterns stored in the memory 12. If non-processed mask patterns remain, the next mask pattern is designated in step S34, and the readout of mask pattern in step S14 and following processing is repeated.

When the aforementioned processing is performed for all 16 kinds of mask patterns stored in the memory 12, the minimum distance detector 30 detects the minimum Euclidean distance in step S36. The information data $d_6'$ to $d_9'$ are decoded based on the mask pattern at the time when the minimum Euclidean distance is detected. The information data $d_0'$ to $d_9'$ are decoded based on the information data $d_6'$ to $d_9'$ together with $d_0$ to $d_5'$ decoded by the majority decision unit 18 and $d_0'$ decoded by the majority decision unit 24.

As mentioned above, according to the present embodiment, a processing of Reed-Muller decoding by majority decision with the mask symbols removed from a Reed-Muller code using mask symbols, Reed-Muller coding the sum of this decoding result and the mask symbols, and calculating the Euclidean distance between this coded output and the original code is repeated for the number of times as the number of mask patterns, mask symbols corresponding to the minimum distance are determined. The information data are decoded by using these mask symbols. Therefore, the number of checksums to be calculated for the majority decision does not increase compared to the case of Reed-Muller code decoding without using mask symbols. Consequently, a decoding apparatus that can reduce the operation load and the hardware scale can be supplied.

This embodiment can also be used as decoding apparatus of (32, 6) Reed-Muller code, without limiting to (32, 10) Reed-Muller code. For this purpose, a changeover switch 32 is connected between the hard decision unit 10 and the exclusive OR circuit 14, and provides a path for directly supplying the output from the hard decision unit 10 to the checksum calculator 16 bypassing the exclusive OR circuit 14. A changeover switch 34 is connected also between the majority decision unit 24 and the Reed-Muller encoder 26, and the output of the majority decision unit 24 may be output as it is as decoding result.

In the case of the maximum likelihood decoding, it is necessary to calculate correlations between the coded signal and all the code words. However, the present invention enables to decrease the amount of calculation of the correlations by multiplying the coded signal and the mask symbols beforehand.

Figure 3:
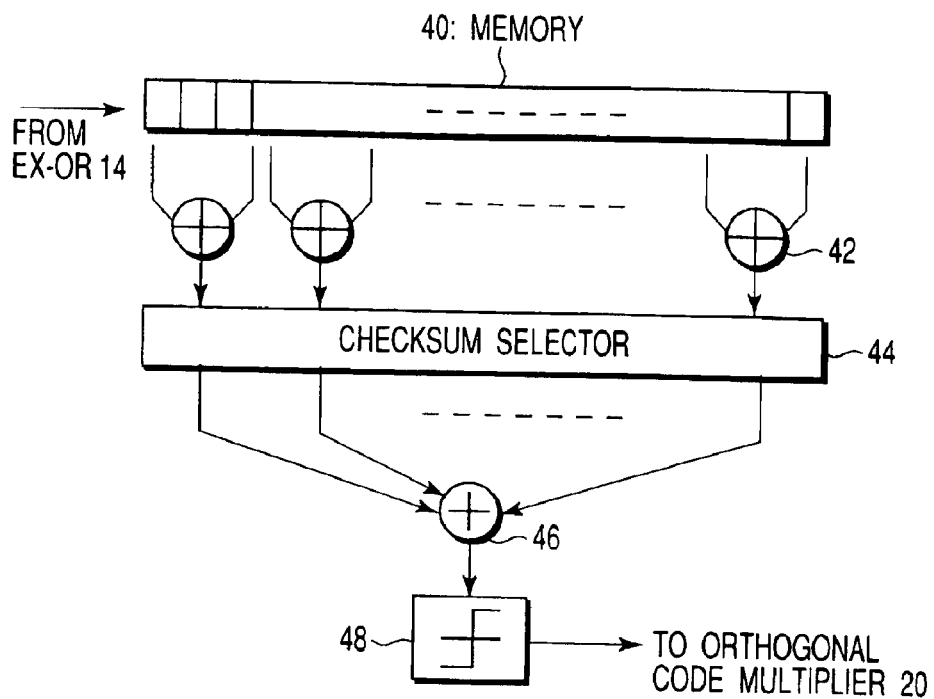
FIG. 3 shows a modification of the checksum calculator and the majority decision circuit of the first embodiment.

FIG. 3 is a modification of the first embodiment in which the checksum calculator 16 and the majority decision unit 18 of FIG. 1 is modified. The modification comprises a memory 40 storing the output from the exclusive OR circuit 14, exclusive OR circuits 42 reading out bit data from the memory 40 and calculating the exclusive ORs, a checksum selector 44 selecting the outputs from the exclusive OR circuits 42 according to the kind of Reed-Muller code, an accumulator 46 accumulatively adding the outputs from the checksum selector 44, and a decision device 48 for hard judging the output from the accumulator 46 and decoding the information bit.

The Reed-Muller code is stored in the memory 40. The combinations of checksums are determined according to the kind of the Reed-Muller code, and exclusive ORs of the combinations according to this are obtained by the exclusive OR circuit 42. For example, 80 checksums are calculated for (32, 6) Reed-Muller code, while only 32 checksums are calculated for (16, 5) Reed-Muller code. The outputs from the exclusive OR circuits 42 are selected by the checksum selector 44 for which bit to be used as code, accumulatively added by the accumulator 46, and the bit is decided by the decision device 48.

Other embodiments of the decoding apparatus according to the present invention will be described. The same portions as those of the first embodiment will be indicated in the same reference numerals and their detailed description will be omitted.

Second Embodiment

Figure 4:
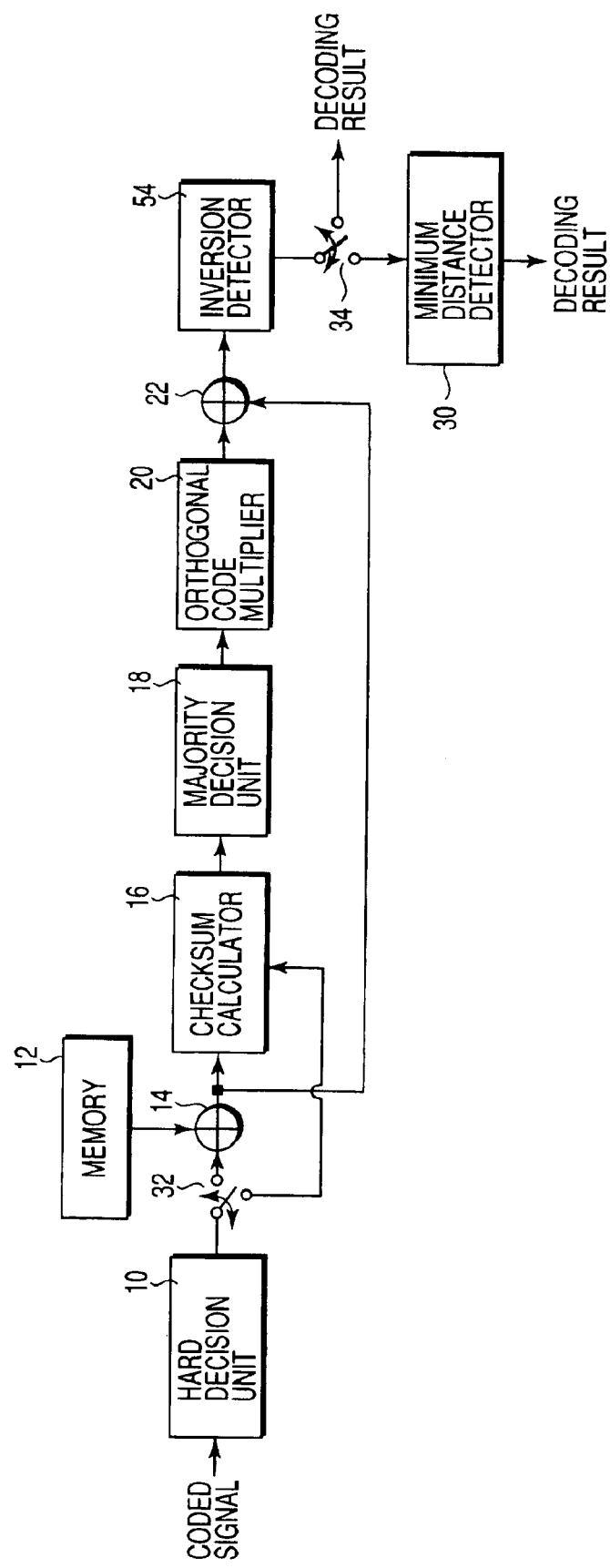
FIG. 4 shows the second embodiment of the decoding apparatus according to the present invention.

FIG. 4 shows a second embodiment of the decoding apparatus which is simplifier than the first embodiment.

Comparing the output (expression (5)) of the exclusive OR circuit 22 and the Euclidean distance (expression (8)) between the output (expression (7)) of the Reed-Muller encoder 26 and the output (expression (2)) of the hard decision circuit 10, it is found that the expression (8) includes $d_0'C_0$ which is not included in the expression (5). If $d_0'=1$, the expression (8) is an inversion of the expression (5) since $C_0$ is a code of all 1.

Therefore, it can be determined that one of the output (expression (5)) of the exclusive OR circuit 22 and the inverted signal of the output of the exclusive OR circuit 22 which has the shorter Euclidean distance is a correct code. Thus, it is unnecessary to provide the majority decision unit 24, the Reed-Muller encoder 26, and the Euclidean distance calculator 28 of FIG. 1.

A result of accumulation of each bit of the expression (5) represents the Euclidean distance between the output (expression (7)) of the Reed-Muller encoder 26 (where $d_0'=0$) and the received coded data. A result of accumulation of each bit of an inversion of the expression (5) represents the Euclidean distance between the output (expression (7)) of the Reed-Muller encoder 26 (where $d_0'=1$) and the received coded data. The number of "1"s included in the accumulation result equals to the Euclidean distance.

Therefore, the output from the exclusive OR circuit 22 is supplied to an inversion detector 54 and the accumulation result of the expression (5) and the accumulation result of an inversion of the expression (5) are compared. Smaller one is supplied to the minimum distance detector 30.

The aforementioned processing is performed for all 16 kinds of mask patterns corresponding to $d_6$ to $d_9$, and the minimum Euclidean distance is detected by the minimum distance detector 30. Bit data $d_0'$ to $d_9'$ at the time when the minimum distance is detected are considered to be correct, completing the decoding.

This embodiment can also be used as decoding apparatus of (32, 6) Reed-Muller code. Thus, the changeover switch 32 is connected between the hard decision unit 10 and the exclusive OR circuit 14, and the changeover switch 34 is connected between the inversion detector 54 and the minimum distance detector 30.

Figure 5:
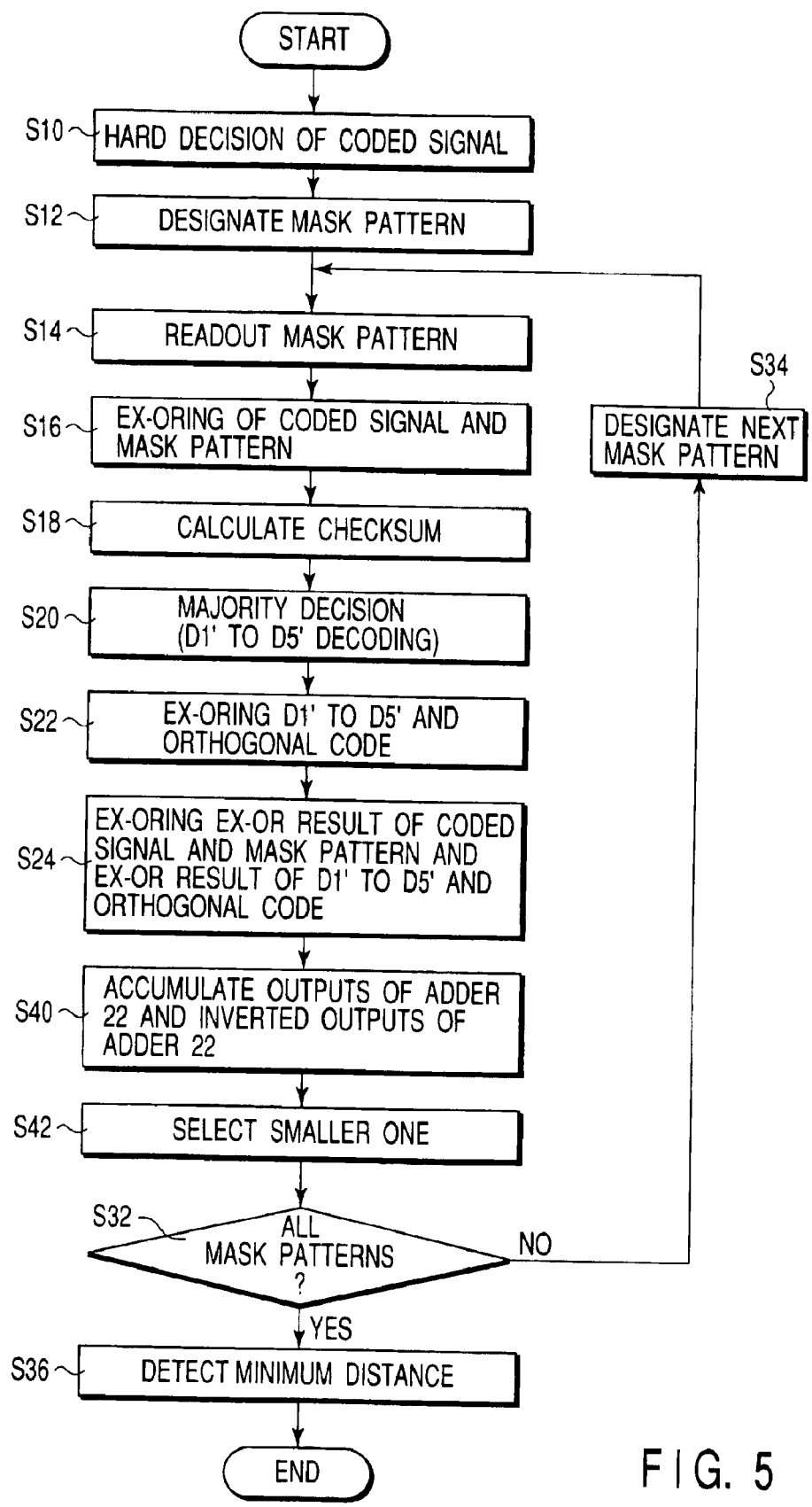
FIG. 5 is a flow chart showing an operation flow of the second embodiment.

FIG. 5 is a flow chart of the second embodiment. Step S10 to step S24 of FIG. 5 are the same as those of FIG. 2. In the second embodiment, after step S24 in which the exclusive OR circuit 22 calculates the exclusive OR of the output (expression (3)) from the exclusive OR circuit 22 and the output (expression (4)) from the orthogonal code multiplier 20, the inversion detector 54 calculates in step S40 the accumulation result of bits of the output from the exclusive OR circuit 22 and the accumulation result of bits of the inverted output from the exclusive OR circuit 22. In step S42, the smaller one of the two accumulation results is selected and is supplied to the minimum distance detector 30.

In step S32, it is determined whether the aforementioned processing is performed for all 16 kinds of mask patterns stored in the memory 12. If non-processed mask patterns remain, the next mask pattern is designated in step S34, and the readout of mask pattern in step S14 and following processing is repeated.

When the aforementioned processing is performed for all 16 kinds of mask patterns stored in the memory 12, the minimum distance detector 30 detects in step S36 the minimum Euclidean distance.

Third Embodiment

FIG. 6 shows a decoding apparatus of (32, 10) Reed-Muller code according to the third embodiment. Though the first and second embodiments relate to the hard decision, the third embodiment relates to a soft decision.

The following definition will be used for the description below.

"^" means an exclusive OR operation. For two vectors, A and B, "A^B" represents the exclusive OR of components of respective vectors A and B.

m(A) represents the vector A in which each of components 0 and 1 is changed to +1 and −1.

10-bit information data to be encoded are assumed to be $d_0$, $d_1$, $d_2$, $d_3$, $d_4$, $d_5$, $d_6$, $d_7$, $d_8$ and $d_9$. Each bit data $d_n$ is 0 or 1.

Orthogonal codes used for encoding are assumed to be $C_0$, $C_1$, $C_2$, $C_3$, $C_4$ and $C_5$. Each code $C_n$ is a 32-bit data, and 32 elements thereof are 0 or 1. Note that $C_0$ is a series of all 1.

Similarly, assuming mask symbols used for encoding be $M_1$, $M_2$, $M_3$ and $M_4$. Each mask symbol $M_n$ is a 32-bit data. The mask patterns $d_6 M_1 \hat{} d_7 M_2 \hat{} d_8 M_3 \hat{} d_9 M_4$, which are exclusive ORs of the mask symbols and the information data, have $2^4=16$ patterns.

An encoding apparatus encodes the aforementioned information data "d" based on the orthogonal codes $C_0$ to $C_5$ and the mask symbols $M_1$ to $M_4$, and outputs the following 32-bit coded signal m(s). Here, the orthogonal codes and the mask symbols to be multiplied with each bit of the information data are predetermined.

$$M(s)=m(d_0 C_0 \hat{} d_1 C_1 \hat{} d_2 C_2 \hat{}$$

$$d_3 C_3 \hat{} d_4 C_4 \hat{} d_5 C_5 \hat{} d_6 M_1 \hat{}$$

$$d_7 M_2 \hat{} d_8 M_3 \hat{} d_9 M_4) \quad (21)$$

In this embodiment, the following signal in which an error "e" due to transfer path or noise is added to the 32-bit coded signal m(s) is input to the decoding apparatus of FIG. 6.

$$m(d_0 C_0 \hat{} d_1 C_1 \hat{} d_2 C_2 \hat{} d_3 C_3 \hat{}$$

$$d_4 C_4 \hat{} d_5 C_5 \hat{} d_6 M_1 \hat{} d_7 M_2 \hat{}$$

$$d_8 M_3 \hat{} d_9 M_4)+E \quad (22)$$

A multiplier 60 multiplies the received coded signal by the mask pattern which is represented by +1 and −1 and read from the memory 12.

The output from the multiplier 60 is supplied to the checksum calculator 16 in the same manner as the first embodiment. The calculator 16 calculates 16 checksums for each of 5 bits of $d_1$ to $d_5$ (80 checksums in total), among 10-bit information data $d_0$ to $d_9$.

The majority decision unit 18 decides a majority of the 80 checksums output from the checksum calculator 16 to decode bits $d_1'$ to $d_5'$ corresponding to the orthogonal codes $C_1$ to $C_5$. To be more specific, concerning the checksum, it is decided to be 0 if it is positive, and 1 if it is negative.

The orthogonal code multiplier 20 multiplies 5-bit data $d_1$ to $d_5'$ by the orthogonal codes.

A multiplier 62 multiplies the output from the multiplier 60 and the output from the orthogonal code multiplier 20 which is represented by +1 and −1. In the same manner as the first embodiment, the majority decision unit 24 decides a majority of the output from the multiplier 62 to decode bit $d_0'$. To be more specific, concerning the output from the multiplier 62, it is decided to be 0 if it is positive, and 1 if it is negative. When the bit $d_0'$ of the information data is determined by the majority decision unit 24, bits $d_6'$ to $d_9'$ of the information data can be determined based on the mask pattern used for determining the bit $d_0'$.

Thus, the information data $d_0'$ to $d_9'$ are determined. The Reed-Muller encoder 26 encodes the determined information data $d_0'$ to $d_9'$. A correlation calculator 64 calculates a correlation between the received coded signal and the output from the Reed-Muller encoder 26.

The aforementioned processing is performed for all 16 kinds of the mask patterns, and the maximum correlation is detected by a maximum detector 66. Bit data $d_0'$ to $d_9'$ at the time when the maximum correlation is detected are considered to be correct, completing the decoding.

One mask pattern is specified in step S60, this specified mask pattern is read out from the memory 12 in step S62, and the multiplier 60 multiplies the received coded signal by the mask pattern.

The memory 12 stores the orthogonal codes $C_0$ to $C_5$, mask symbols $M_1$ to $M_4$, and 16 mask patterns $d_6 M_1\hat{\,}d_7 M_2\hat{\,}d_8 M_3\hat{\,}d_9 M_4$ not shown in Table 1. "i" represents a bit position.

Supposing the mask pattern read out from the memory 12 be $M'=m(d_6'M_1\hat{\,}d_7'M_2\hat{\,}d_8'M_3\hat{\,}d_9'M_4)$, the product of the received coded signal and the mask pattern will be as follows.

$$m(d_0 C_0\hat{\,}d_1 C_1\hat{\,}d_2 C_2\hat{\,}d_3 C_3\hat{\,}$$

$$d_4 C_4\hat{\,}d_5 C_5\hat{\,}(d_6\hat{\,}d_6')M_1\hat{\,}$$

$$(d_7\hat{\,}d_7')M_2\hat{\,}(d_8\hat{\,}d_8')M_3\hat{\,}(d_9$$

$$\hat{\,}d_9')M_4)+E \qquad (23)$$

In step S66, the checksum calculator 16 calculates the checksum of the expression (23) output from the multiplier 60. Respectively, 16 checksums are calculated for 5 bits of $d_1$ to $d_5$, in the 10-bit information data of $d_0$ to $d_9$.

In step S68, these 80 outputs in total are decided by majority by the majority decision unit 18, and $d_1'$ to $d_5'$ are decoded. To be more specific, concerning the checksum output, it is decided to be 0 if it is positive, and 1 if it is negative.

In step S70, the orthogonal code multiplier 20 multiplies 5-bit information data $d_1'$ to $d_5'$ by the orthogonal codes corresponding to the 5-bit information data $d_1'$ to $d_5'$. The output from the orthogonal code multiplier 20 is as follows.

$$m(d_1'C_1\hat{\,}d_2'C_2\hat{\,}d_3'C_3\hat{\,}d_4'C_4\hat{\,}d_5'C_5) \qquad (24)$$

In step S72, the multiplier 62 multiplies the output (expression (23)) from the multiplier 60 and the output (expression (24)) from the orthogonal code multiplier 20. The output from the multiplier 62 is as follows.

$$m(d_0 C_0\hat{\,}(d_1\hat{\,}d_1')C_1\hat{\,}(d_2\hat{\,}$$

$$d_2')C_2\hat{\,}(d_3\hat{\,}d_3')C_3\hat{\,}(d_4\hat{\,}$$

$$d_4')C_4\hat{\,}(d_5\hat{\,}d_5')C_5\hat{\,}(d_6\hat{\,}$$

$$d_6')M_1\hat{\,}(d_7\hat{\,}d_7')M_2\hat{\,}(d_8\hat{\,}$$

$$d_8')M_3\hat{\,}$$

$$(d_9\hat{\,}d_9')M_4)+E \qquad (25)$$

Here, if $d_1'$ to $d_9'$ are correctly decoded, the term of $(d_n\hat{\,}d_n')C_n$ (n=1, 2, . . . 9) becomes a 0 vector. In this case, the output (expression (25)) from the multiplier 62 is as follows.

$$m(d_0 C_0)+E \qquad (26)$$

Since $C_0$ is all 1, $d_0'$ can be obtained by judging the output (expression (26)) from the multiplier 62 by the majority decision unit 24 (step S74). To be more specific, each bit of the information data is decided to be 0 if it is positive, and 1 if it is negative in the output (expression (26)) from the multiplier 62. When bit $d_0'$ of the information data is determined by the majority decision unit 24, bits $d_6'$ to $d_9'$ of the information data can be determined from the mask pattern used for this determination. The operation mentioned above allows to determine respective bits $d_0'$ to $d_9'$ of the information data.

This information data $d_0'$ to $d_9'$ is Reed-Muller encoded by the Reed-Muller encoder 26 as follows, in step S76.

$$m(d_0'C_0\hat{\,}d_1'C_1\hat{\,}d_2'C_2\hat{\,}d_3'$$

$$C_3\hat{\,}d_4'C_4\hat{\,}d_5'C_5\hat{\,}d_6'M_1\hat{\,}$$

$$d_7'M_2\hat{\,}d_8'M_3\hat{\,}d_9'M_4) \qquad (27)$$

In step S78, the correlation calculator 64 calculates the correlation between the output (expression (27)) from the Reed-Muller encoder 26 and the received coded signal (expression (22)). To be more specific, first, the product of the output (expression (27)) from the Reed-Muller encoder 26 and the received coded signal (expression (22)) is obtained as follows:

$$m((d_0\hat{\,}d_0')C_0\hat{\,}(d_1\hat{\,}d_1')C_1\hat{\,}$$

$$(d_2\hat{\,}d_2')C_2\hat{\,}(d_3\hat{\,}d_3')C_3\hat{\,}$$

$$(d_4\hat{\,}d_4')C_4\hat{\,}(d_5\hat{\,}d_5')C_5\hat{\,}$$

$$(d_6\hat{\,}d_6')M_1\hat{\,}(d_7\hat{\,}d_7')M_2\hat{\,}(d_8\hat{\,}$$

$$d_8')M_3\hat{\,}(d_9\hat{\,}d_9')M_4)+E \qquad (28)$$

Expression (28) represents a 32-bit signal, and the accumulation result of these 32 bits represents the correlation between the output (expression (27)) from the Reed-Muller encoder 26 and the received coded signal (expression (22)).

In step S80, it is determined whether the aforementioned processing is performed for all 16 kinds of mask patterns stored in the memory 12. If non-processed mask patterns remain, the next mask pattern is designated in step S82, and the readout of mask pattern in step S62 and following processing is repeated.

When the aforementioned processing is performed for all 16 kinds of mask patterns stored in the memory 12, the maximum detector 66 detects the maximum correlation in step S84. The information data $d_6'$ to $d_9'$ are decoded based on the mask pattern at the time when the maximum correlation is detected. The information data $d_0'$ to $d_9'$ are decoded based on the information data $d_6'$ to $d_9'$ together with $d_0'$ to $d_5'$ decoded by the majority decision unit 18 and $d_0'$ decoded by the majority decision unit 24.

As mentioned above, according to the present embodiment, a processing of Reed-Muller decoding by majority decision with the mask symbols removed from a Reed-Muller code using mask symbols, Reed-Muller coding the sum of this decoding result and the mask symbols, and calculating the correlation between this coded output and the original code is repeated for the number of times as the number of mask patterns, mask patterns corresponding to the maximum correlation are determined. The information data are decoded by using these mask symbols. Therefore, the number of checksums to be calculated for the majority decision does not increase compared to the case of Reed-Muller code decoding without using mask symbols. Consequently, a decoding apparatus that can reduce the operation load and the hardware scale can be supplied. Further, this embodiment utilizes the soft decision. The majority decision in the soft decision system is performed at a higher precision than in the hard decision system.

This embodiment can also be used as decoding apparatus of (32, 6) Reed-Muller code. Thus, the changeover switch 32 is connected between the coded signal input terminal and the multiplier 60, and the changeover switch 34 is connected between the majority decision unit 24 and the Reed-Muller encoder 26.

Figure 8:
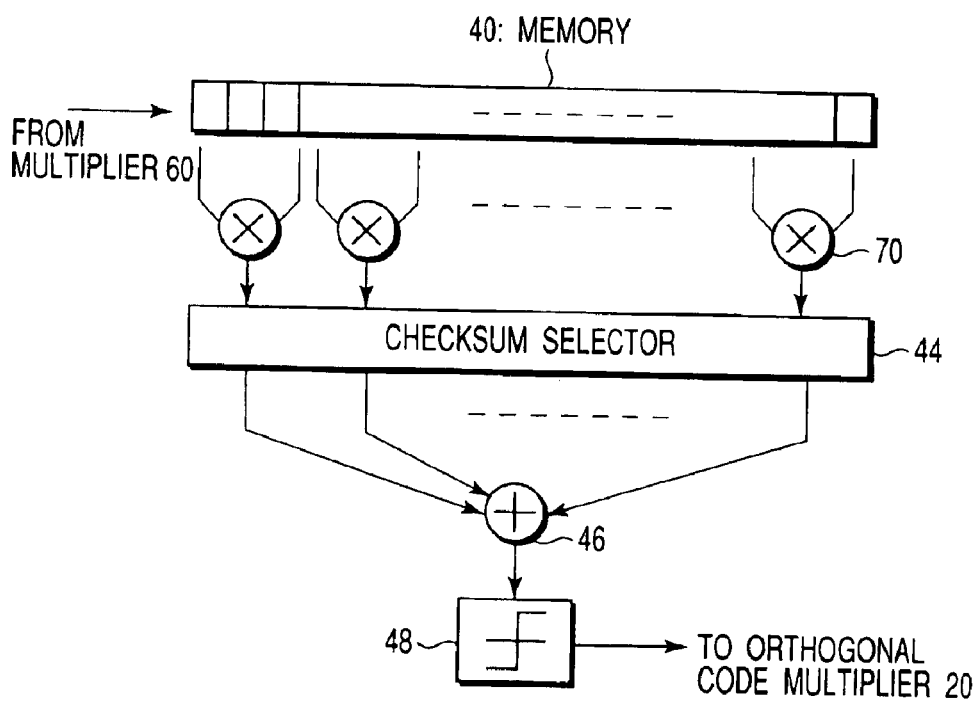
FIG. 8 shows a modification of the checksum calculator and the majority decision circuit of the third embodiment.

FIG. 8 is a modification of the third embodiment in which the checksum calculator 16 and the majority decision unit 18 of FIG. 6 is modified. The modification comprises the memory 40 storing the output from the multiplier 60, multipliers 62 reading out bit data from the memory 40 and calculating products, the checksum selector 44 selecting the outputs from the multipliers 70 according to the kind of Reed-Muller code, the accumulator 46 accumulatively adding the outputs from the checksum selector 44, and the decision device 48 for hard judging the output from the accumulator 46 and decoding the information bit.

Fourth Embodiment

Figure 9:
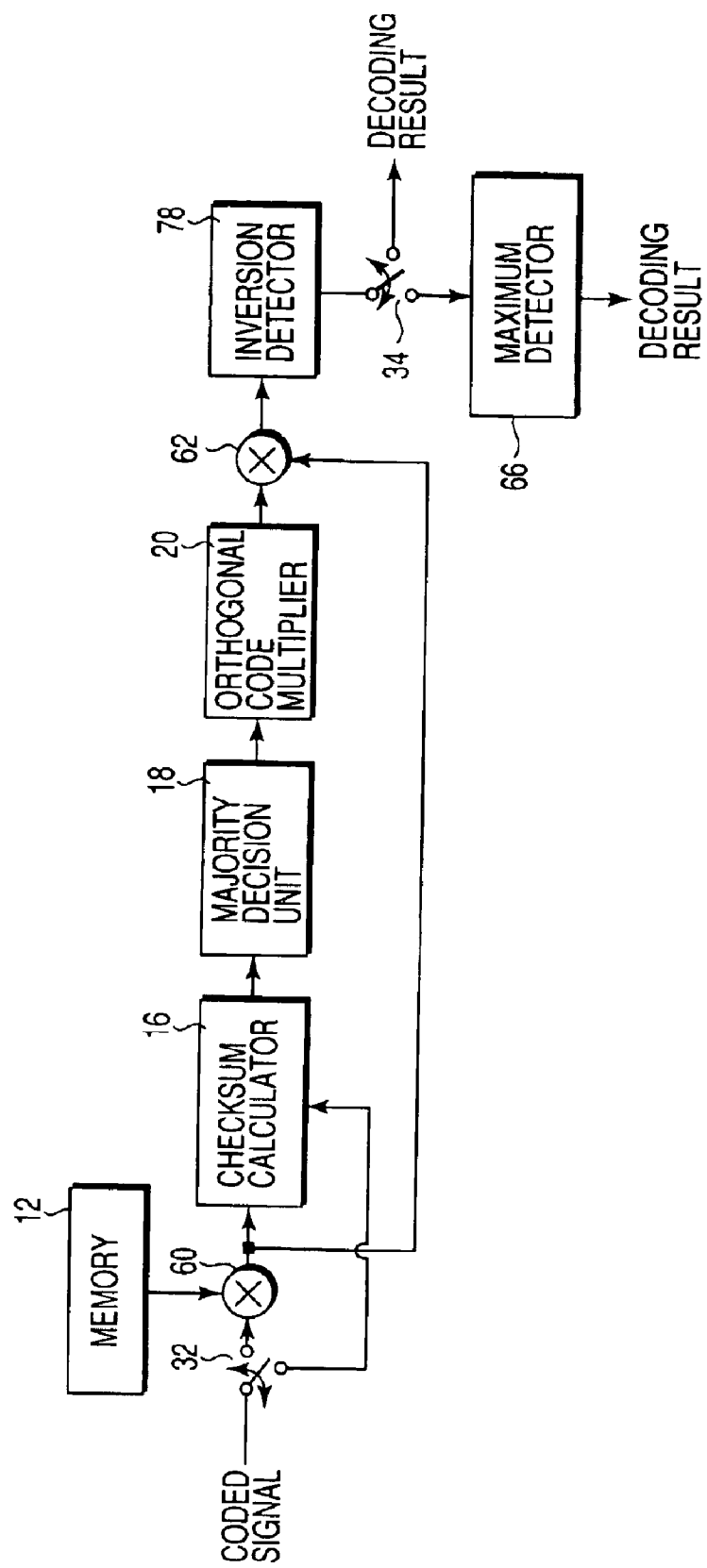
FIG. 9 shows the fourth embodiment of the decoding apparatus according to the present invention.

FIG. 9 shows the fourth embodiment of the decoding apparatus which is simplifier than the third embodiment.

Comparing the output (expression (25)) of the multiplier 62 and the correlation (expression (28)) between the output (expression (27)) of the Reed-Muller encoder 26 and the output (expression (22)) of the received coded signal, it is found that the expression (28) includes $d_0'C_0$ which is not included in the expression (25). If $d_0'=1$, the expression (28) is an inversion of the expression (25) since $C_0$ is a code of all 1.

Therefore, it can be determined that one of the accumulation result of the output (expression (25)) of the multiplier 62 and the accumulation result of the inverted signal of the output of the multiplier 62 which is larger can be used as the correlation. Thus, it is unnecessary to provide the majority decision unit 24, the Reed-Muller encoder 26, and the correlation calculator 64 of FIG. 6.

A result of accumulation of each bit of the expression (25) equals to the correlation between the output (expression (27)) of the Reed-Muller encoder 26 (where $d_0'=0$) and the received coded data (expression (22)). A result of accumulation of each bit of an inversion of the expression (25) equals to the correlation between the output (expression (27)) of the Reed-Muller encoder 26 (where $d_0'=1$) and the received coded data.

Therefore, the output from the multiplier 62 is supplied to an inversion detector 78 and the accumulation result of the expression (25) and the accumulation result of an inversion of the expression (25) are compared. Larger one is supplied to the maximum distance detector 66.

The aforementioned processing is performed for all 16 kinds of mask patterns corresponding to $d_6$ to $d_9$, and the maximum correlation is detected by the maximum detector 66. Bit data $d_0'$ to $d_9'$ at the time when the maximum correlation is detected are considered to be correct, completing the decoding.

This embodiment can also be used as decoding apparatus of (32, 6) Reed-Muller code. Thus, the changeover switch 32 is connected between the coded signal input terminal and the multiplier 60, and the changeover switch 34 is connected between the inversion detector 78 and the maximum detector 66.

Figure 7:
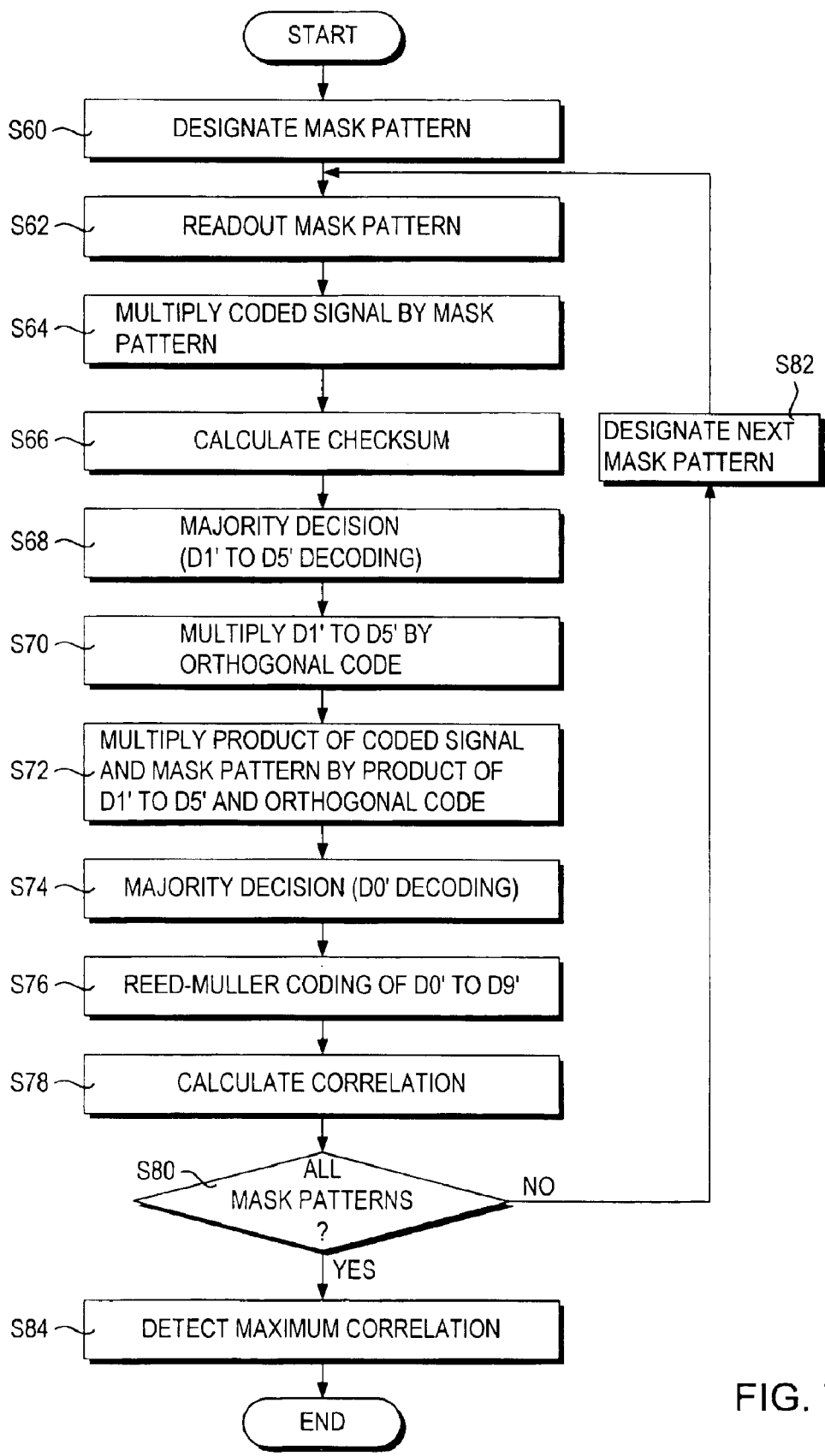
FIG. 7 is a flow chart showing an operation flow of the third embodiment.
Figure 10:
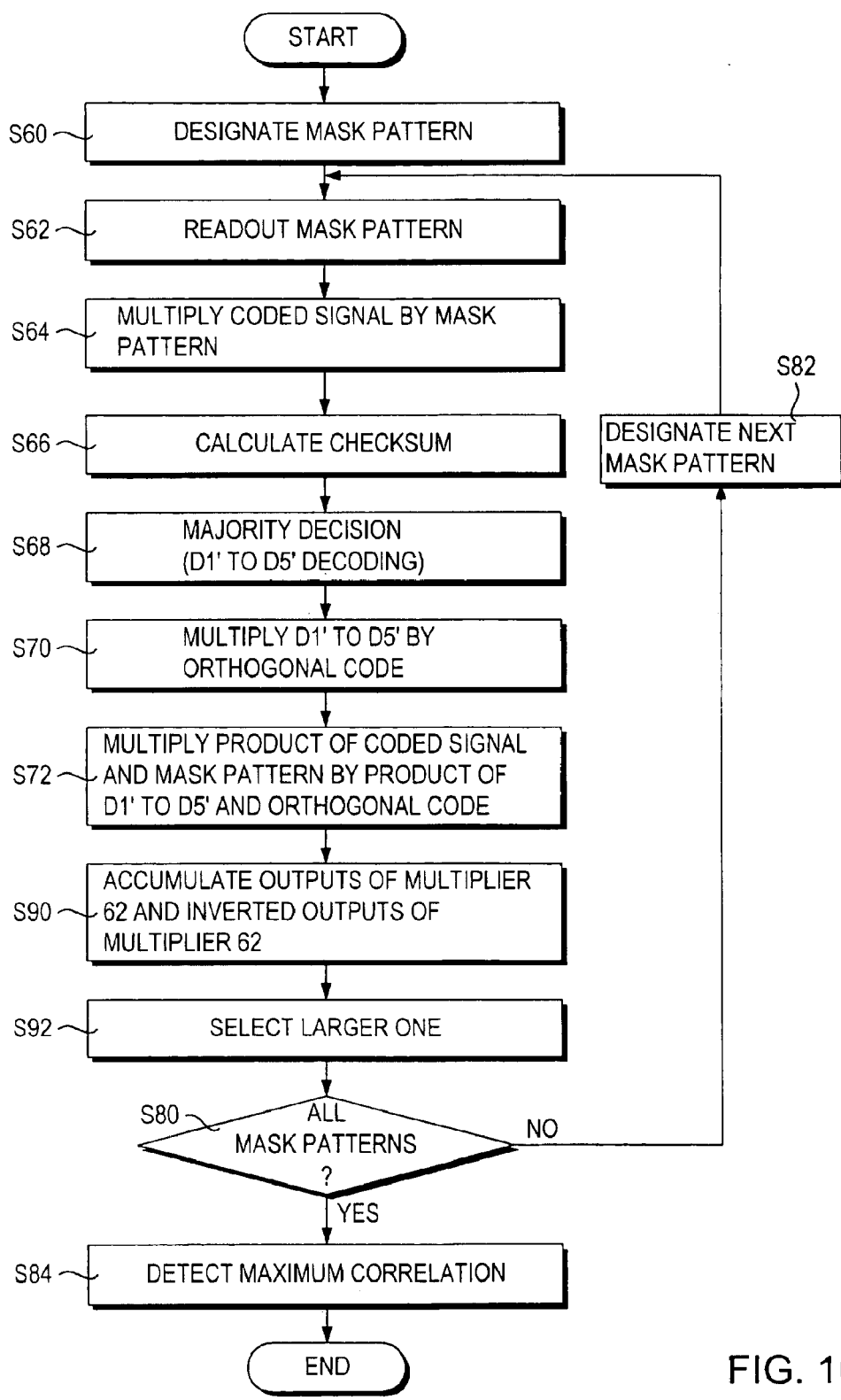
FIG. 10 is a flow chart showing an operation flow of the fourth embodiment.

FIG. 10 is a flow chart of the fourth embodiment. Step S60 to step S72 of FIG. 10 are the same as those of FIG. 7. In the fourth embodiment, after step S72 in which the multiplier 62 calculates the product of the output (expression (23)) from the multiplier 60 and the output (expression (24)) from the orthogonal code multiplier 20, the inversion detector 78 calculates in step S90 the accumulation result of bits of the output from the multiplier 62 and the accumulation result of bits of the inverted output from the multiplier 62. In step S92, the larger one of the two accumulation results is selected and is supplied to the maximum detector 66.

In step S80, it is determined whether the aforementioned processing is performed for all 16 kinds of mask patterns stored in the memory 12. If non-processed mask patterns remain, the next mask pattern is designated in step S82, and the readout of mask pattern in step S62 and following processing is repeated.

When the aforementioned processing is performed for all 16 kinds of mask patterns stored in the memory 12, the maximum detector 66 detects in step S84 the maximum correlation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for decoding a Reed-Muller code in which information data is encoded by using mask symbols and orthogonal codes, the information data including a first portion and a second portion, the apparatus comprising:

an arithmetic operation unit to calculate an exclusive OR of a first Reed-Muller code and each of a plurality of mask patterns to obtain a first exclusive OR output, each of the mask patterns representing an exclusive ORed value of the mask symbols and the first portion of the information data;

a first decoder to decode a part of the second portion of the information data that corresponds to the orthogonal codes by calculating a checksum of the first exclusive OR output to obtain a plurality of checksum outputs and deciding by majority a value of each of the checksum outputs;

a second decoder to decode a remaining part of the second portion of the information data by calculating a second exclusive OR of the first exclusive OR output and a product of the part of the second portion of the information data and the orthogonal codes to obtain a second exclusive OR output, and deciding by majority a value of the second exclusive OR output;

a Reed-Muller encoder to encode the decoded second portion of the information data and the first portion of the information data into a plurality of second Reed-Muller codes corresponding to the mask patterns, the decoded second portion including the decoded part and the decoded remaining part output from the first decoder and the second decoder;

a Euclidean distance calculator to calculate a Euclidean distance between the first Reed-Muller code and each of the second Reed-Muller codes to obtain a plurality of Euclidean distances; and a minimum distance detector to detect a minimum Euclidean distance among the Euclidean distances to decode the information data using one of the mask patterns that corresponds to the minimum Euclidean distance.

2. The apparatus according to claim 1, further comprising a memory to store a plurality of exclusive ORed values corresponding to the mask patterns, and wherein the arithmetic operation unit calculates the exclusive OR of the first Reed-Muller code and each of the plurality of exclusive ORed values stored in the memory.

3. The apparatus according to claim 1, further comprising a hard decision unit to hard-decide the first Reed-Muller code supplied to the arithmetic operation unit.

4. The apparatus according to claim 1, wherein the first decoder comprises:

a memory to store the first exclusive OR output from the arithmetic operation unit;

a checksum calculator to read bit data from the memory and calculate a plurality of exclusive ORs of a plurality of sets of the read bit data to obtain the checksum outputs;

a selector to select some of the plurality of checksum outputs based on a type of the Reed-Muller code;

an accumulator to accumulate the selected checksums; and a hard decision unit to hard-decide an output from the accumulator.

5. A method of decoding a Reed-Muller code in which information data is encoded by using mask symbols and orthogonal codes, the information data including a first portion and a second portion, the method comprising:

calculating an exclusive OR of a first Reed-Muller code and each of a plurality of mask patterns to obtain a first exclusive OR output, each of the mask patterns representing an exclusive ORed value of the mask symbols and the first portion of the information data;

calculating a checksum of the first exclusive OR output to obtain a plurality of checksum outputs;

deciding by majority a value of each of the checksum outputs to decode a part of the second portion of the information data corresponding to the orthogonal codes;

calculating a second exclusive OR of the first exclusive OR output and a product of the part of the second portion of the information data and the orthogonal codes to obtain a second exclusive OR output;

deciding by majority a value of the second exclusive OR output to decode a remaining part of the second portion of the information data;

encoding the decoded second portion of the information data and the first portion of the information data into a second Reed-Muller code, the decoded second portion including the decoded part and the decoded remaining part;

calculating a Euclidean distance between the first Reed-Muller code and each of the second Reed-Muller codes to obtain a plurality of Euclidean distances; and detecting a minimum Euclidean distance among Euclidean distances to decode the information data using one of the mask patterns that corresponds to the minimum Euclidean distance.

6. An apparatus for decoding Reed-Muller code in which information data is encoded by using mask symbols and orthogonal codes, the information data including a first portion and a second portion, the apparatus comprising:

a first arithmetic operation unit to calculate an exclusive OR of the Reed-Muller code and each of a plurality of mask patterns to obtain an exclusive OR output, each of the mask patterns representing an exclusive ORed value of the mask symbols and the first portion of the information data;

a decoder to decode the second portion of the information data which corresponds to the orthogonal codes by calculating a checksum of the exclusive OR output to obtain a plurality of checksum outputs and deciding by majority a value of each of the checksum outputs;

a second arithmetic operation unit to calculate a first accumulation result of bits of a product of an output from the decoder and the orthogonal codes and a second accumulation result of inverted bits of a product of the output from the decoder and the orthogonal codes and detect one of the first accumulation result and the second accumulation result which corresponds to a smaller Euclidean distance between the Reed-Muller code input to the first arithmetic operation unit and encoded data of decoded data of the decoder;

a minimum detector to detect the minimum of an output from the second arithmetic operation unit while the mask patterns are supplied to the first arithmetic operation unit; and a decoder to decode the first portion of the information data based on the mask pattern corresponding to the minimum of the output from the second arithmetic operation unit.

7. The apparatus according to claim 6, further comprising a memory to store a plurality of exclusive ORed values of the mask patterns and the information data corresponding to the mask patterns, and wherein the first arithmetic operation unit calculates the exclusive OR of the Reed-Muller code and each of the plurality of exclusive ORed values stored in the memory.

8. The apparatus according to claim 6, further comprising a hard decision unit to hard-decide the Reed-Muller code supplied to the first arithmetic operation unit.

9. The apparatus according to claim 6, wherein the decoder comprises:

a memory to store the exclusive OR output from the first arithmetic operation unit;

a checksum calculator to read bit data from the memory and calculate a plurality of exclusive ORs of a plurality of sets of the read bit data to obtain the checksum outputs;

a selector to select some of the checksum outputs based on a type of the Reed-Muller code;

an accumulator to accumulate the selected checksum outputs; and a hard decision unit to hard-decide an output from the accumulator.

10. A method of decoding a Reed-Muller code in which information data is encoded by using mask symbols and orthogonal codes, the information data including a first portion and a second portion, the method comprising:

calculating an exclusive OR of the Reed-Muller code and each of a plurality of mask patterns to obtain a first Reed-Muller code, each of the mask patterns representing an exclusive ORed value of the mask symbols and the first portion of the information data;

calculating a checksum of the exclusive OR to obtain a plurality of checksum outputs;

deciding by majority a value of each of the checksums to decode a part of the second portion of the information data corresponding to the orthogonal codes;

calculating a first accumulation result of bits of a product of decoded data and the orthogonal codes and a second accumulation result of inverted bits of a product of the decoded data and the orthogonal codes;

detecting one of the first accumulation result and the second accumulation result which corresponds to a smaller Euclidean distance between the Reed-Muller code and encoded data of the decoded data;

detecting the minimum of one of the first accumulation result and the second accumulation result which has a smaller Euclidean distance between the Reed-Muller code and encoded data of the decoded data while calculating the exclusive OR of the Reed-Muller code and an exclusive ORed value of each of the mask patterns and the information data, decoding the first portion of the information data based on the mask pattern corresponding to the minimum of one of the first accumulation result and the second accumulation result which has a smaller Euclidean distance between the Reed-Muller code and encoded data of the decoded data.

11. An apparatus for decoding a Reed-Muller code in which information data is encoded by using mask symbols and orthogonal codes, the information data including a first portion and a second portion, the apparatus comprising:

an arithmetic operation unit to calculate a first product of a first Reed-Muller code and each of a plurality of mask patterns to obtain a first exclusive OR output, each of the mask patterns representing an exclusive ORed value of the mask symbols and the first portion of the information data;

a first decoder to decode a part of the second portion of the information data corresponding to the orthogonal codes by calculating a checksum of the first product to obtain a plurality of checksum outputs and deciding by majority each of the checksum outputs;

a second decoder to decode a remaining part of the second portion of the information data corresponding to the orthogonal codes by calculating a second product of the first product and a product of the part of the second portion of the information data and the orthogonal codes and deciding by majority the second product;

a Reed-Muller encoder to encode the second portion of the information data output from the first decoder and the second decoder and the first portion of the information data into a Reed-Muller code;

a maximum correlation detector to detect the maximum of a correlation between an output from the first Reed-Muller encoder and the second Reed-Muller code while the mask patterns are supplied to the arithmetic operation unit;

a decoder to decode the first portion of the information data based on the mask pattern corresponding to the maximum of the correlation.

12. The apparatus according to claim 11, further comprising a memory to store a plurality of exclusive ORed values of the mask patterns and the information data corresponding to the mask patterns, and wherein the arithmetic operation unit calculates the first product of the first Reed-Muller code and each of the plurality of exclusive ORed values stored in the memory.

13. The apparatus according to claim 11, wherein the first decoder comprises:

a memory to store the first product;

a checksum calculator to read bit data from the memory and calculate a plurality of exclusive ORs of a plurality of sets of the read bit data to obtain the plurality of checksum outputs;

a selector to select some of the plurality of checksum outputs based on a type of the Reed-Muller code; and an accumulator to accumulate the selected checksum outputs.

14. A method of decoding Reed-Muller code in which information data is encoded by using mask symbols and orthogonal codes, the information data including a first portion and a second portion, the method comprising:

calculating a first product of the Reed-Muller code and each of a plurality of mask patterns, each of the mask patterns representing an exclusive ORed value of the mask symbols and the information data;

calculating a checksum of the first product to obtain a plurality of checksum outputs;

deciding by majority a value of each of the checksum outputs to decode a part of the second portion of the information data corresponding to the orthogonal codes;

calculating a second product of the first product and a product of the part of the second portion of the information data and the orthogonal codes;

deciding by majority the second product to decode a remaining part of the second portion of the information data corresponding to the orthogonal codes;

encoding the second portion of the information data and the first portion of the information data into a second Reed-Muller code; and detecting the maximum of a correlation between the first Reed-Muller code and the second Reed-Muller code while a plurality of first products are calculated, whereby the first portion of the information data is decoded based on the mask pattern corresponding to the maximum of the correlation.

15. An apparatus for decoding Reed-Muller code in which information data is encoded by using mask symbols and orthogonal codes, the information data including a first portion and a second portion, the apparatus comprising:

a first arithmetic operation unit to calculate a first product of the Reed-Muller code and each of a plurality of mask patterns, each of the mask patterns representing an exclusive ORed value of the mask symbols and the information data;

a decoder to decode a part of the second portion of the information data corresponding to the orthogonal codes by calculating a checksum of the first product and deciding by majority the checksum;

a second arithmetic operation unit to calculate a first accumulation result of bits of a product of an output from the decoder and the orthogonal codes and a second accumulation result of inverted bits of a product of the output from the decoder and the orthogonal codes and detect a larger one of the first accumulation result and the second accumulation result;

a maximum detector to detect the maximum of an output from the second arithmetic operation unit while the mask patterns are supplied to the first arithmetic operation unit;

a decoder to decode the first portion of the information data based on the mask pattern corresponding to the maximum of the output from the second arithmetic operation unit.

16. The apparatus according to claim 15, further comprising a memory to store a plurality of exclusive ORed values of the mask patterns and the information data corresponding to the mask patterns, and wherein the first arithmetic operation unit calculates the first product of the first Reed-Muller code and each of the plurality of exclusive ORed values stored in the memory.

17. The apparatus according to claim 15, wherein the decoder comprises:

a memory to store the first product;

a checksum calculator to read bit data from the memory and calculate a plurality of exclusive ORs of a plurality of sets of the read bit data to obtain a plurality of checksums;

a selector to select some of the plurality of checksums based on a type of the Reed-Muller code; and an accumulator to accumulate the selected checksums.

18. A method of decoding Reed-Muller code in which information data is encoded by using mask symbols and orthogonal codes, the information data including a first portion and a second portion, the method comprising:

calculating a first product of the Reed-Muller code and each of a plurality of mask patterns, each of the mask patterns representing an exclusive ORed value of the mask symbols and the information data;

calculating a checksum of the first product;

deciding by majority the checksum to decode a part of the second portion of the information data corresponding to the orthogonal codes;

calculating a first accumulation result of bits of a product of decoded data and the orthogonal codes and a second accumulation result of inverted bits of a product of the decoded data and the orthogonal codes;

detecting a larger one of the first accumulation result and the second accumulation result;

detecting the maximum of the first accumulation result and the second accumulation result while calculating the first product of the Reed-Muller code and an exclusive ORed value of each of the mask patterns and the information data; and decoding the first portion of the information data based on the mask pattern corresponding to the maximum of the first accumulation result and the second accumulation result.

* * * * *